United States Patent [19]

Chen et al.

[11] Patent Number: 5,024,954

[45] Date of Patent: Jun. 18, 1991

[54] METHOD OF IMPROVING HIGH TEMPERATURE STABILITY OF PTSI/SI STRUCTURE

[75] Inventors: Mao-Chieh Chen; Bing-Yue Tsui; Jiunn-Yann Tsai, all of Hsinchu, Taiwan

[73] Assignee: National Science Council, Taipei, Taiwan

[21] Appl. No.: 505,406

[22] Filed: Apr. 6, 1990

[51] Int. Cl.$^5$ ............................................ H01L 21/265
[52] U.S. Cl. ................................... 437/24; 437/178; 437/201; 437/3
[58] Field of Search .......................... 437/24, 178, 201

[56] References Cited

U.S. PATENT DOCUMENTS 3,964,084 6/1976 Andrews Jr. et al. ................ 357/71

OTHER PUBLICATIONS

E. K. Broadbent, et al. "Self Aligned Silicided (PtSi and CoSi$_2$) Ultra-Shallow p+/n Junctions," IEEE EDL-8 No. 7 p. 318, (1987).
F. W. Wu, et al. "Optimization of B$_2$F+Implanted and Radpily Annealed Junctions in Silicon," J. Appl. Phys. 60(7), 10/1/86. p. 2422.
T. P. Chow et al., "Titanium Silicide Formation on BF$_2$+-Implanted Silicon," Appl. Phys. Lett. 46(10 1/1/85 p. 41.
W. Lur and L. J. Chen, "Interfacial Reactions of Titanium Thin Films on BF$_2$+-Implanted (001)Si," J. Appl. Phys. 66(8), 10/15/89, p. 3604.
W. Lur and L. J. Chen, "Interfacial Reactions of Cobalt Thin Films on BF$_2$+Ion-Implanted (DOI) Silicon," J. Appl. Phys. 64(7), 1/1/88 p. 3505.
J. Tsai, B. Tsui and M. Chen, "High-Temperature Stability of Platinum Silicide Associated with Flourine Implantation," J. Appl. Phys. 67(7) 4/1/90 p. 3530.
Andrews, J. M. et al., "Reverse Current-Voltage Characteristics of Metal-Silicide Schottky Diodes" *Solid-State Electronics*, vol. 13, pp. 1011-1023 (1970).
Andrews, J. M., "The Role of the Metal-Semiconductor Interface in Silicon Integrated Circuit Technology" *J. Vac. Sci. Technol.*, vol. 11, No. 6, pp. 972-984 (Nov./Dec. 1974).

Calleja, E. et al., "Thermal Degeneration of Mo and Pt Silicon Schottky Diodes" pp. 591-598 (1979).
Kosonocky, W. F. et al., "160×244 Element PtSi Schottky-Barrier IR CCD Image Sensor" *IEEE Transactions on Electron Devices*, vol. ED-32, No. 8, pp. 1564-1573, (Aug. 1985).
Murarka, S. P., "Refractory Silicdes for Integrated Circuits" *J. Vac. Sci. Technol.*, 17(4), pp. 775-792, (Jul./Aug. 1980).
Murarka, S. P. et al., "High Temperature Stability of PtSi Formed by Reaction of Metal with Silicon or by Co-Sputtering" *J. Appl. Phys.*, 54(12) pp. 6943-6951, (Dec. 1983).
Murarka, S. P., "Self-Aligned Silicides or Metals for very Large Scale Integrated Circuit Applications", *J. Vac. Sci. Techno.* B4(6), pp. 1325-1331 (Nov./Dec. 1986).
Majni, G. et al., "Thin Film Compounds in Planar Pt-Si Reaction" *J. Phys. Chem. Solids*, vol. 46, No. 5, pp. 631-641, (1985).
Prabhakar, A. et al., "Platinum Diffusion into Silicon from PtSi" *Appl. Phys. Lett.*, 43(12), pp. 1118-1120, (Dec. 1983).
Sinha, A. K. et al., "Thermal Stability of Thin PtSi films on Silicon Substrates" *J. Appl. Phys.*, vol. 43, No. 9, pp. 3637-3643, (Sep. 1972).
Wright, P. J. et al., "The Effect of Fluorine in Silicon Diode Gate Dielectrics" *IEEE Transactions on Electron Devices*, vol. 36, No. 5, pp. 879-889, (1989).

*Primary Examiner*—Brian E. Hearn
*Assistant Examiner*—Linda J. Fleck
*Attorney, Agent, or Firm*—Spencer & Frank

[57] ABSTRACT

A method of improving the high temperature stability of PtSi/Si structure is disclosed. A sufficient amount of fluorine-contained ion is implanted into the PtSi/Si structure or Pt/Si structure or Si substrate. The characteristics of the resulted PtSi/Si structure remain unchanged even after annealing at 800° C. in contrast to the conventional PtSi/Si structure whose characteristics start to degrade at 700° C. All devices contacted by PtSi, either ohmic or Schottky contact, are able to withstand an 800° C. high temperature treatment without degradation.

21 Claims, 6 Drawing Sheets

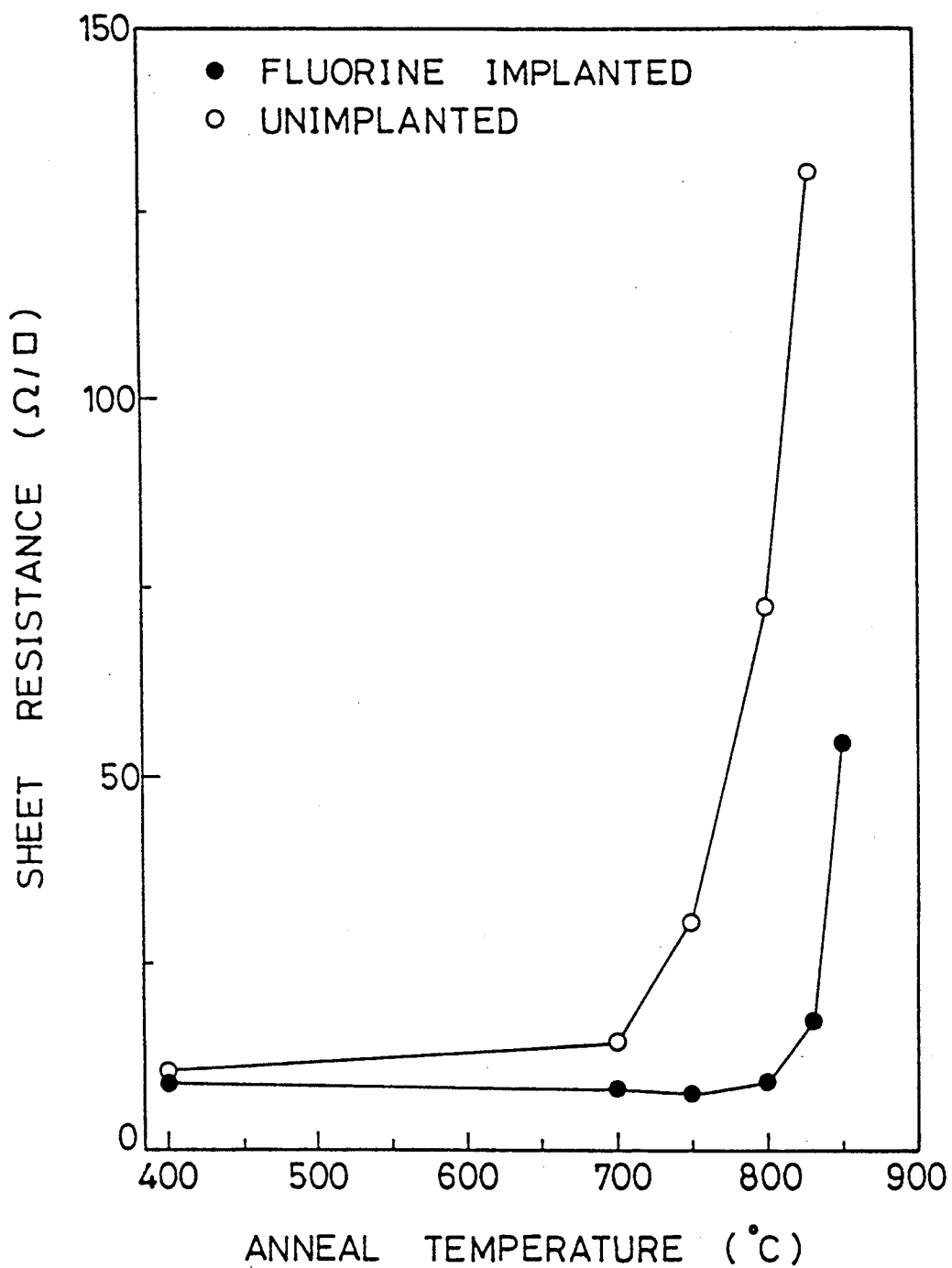
F I G . 1

METHOD OF IMPROVING HIGH TEMPERATURE STABILITY OF PTSI/SI STRUCTURE

BACKGROUND OF THE INVENTION

The present invention relates to a method of improving high temperature stability of platinum silicide (hereinafter referred as PtSi) film on a silicon substrate (hereinafter referred as a PtSi/Si structure), and in particular relates to a method of improving high temperature stability of a PtSi/Si structure by the implantation of fluorine-containing ions.

Platinum silicide (PtSi) has been widely used in silicon based devices and integrated circuits. It forms stable and reproducible Schottky contact on lightly doped n-type silicon and ohmic contact on p-type silicon at room temperature and heavily doped n-type silicon. The PtSi/p-Si structure can also be used as an infrared detector at a low temperature (77° K.). Since PtSi has a resistivity of $30\mu\Omega$-cm, it has been suggested for use as a gate and interconnection metal over polysilicon. However, the high temperature stability of PtSi has always been questionable.

The often quoted high temperature instability of PtSi on silicon apparently arises from the fact that the lowest eutectic point in the Pt-Si system occurs at 830° C. Even after the complete consumption of metal to form silicide at a low temperature, an agglomeration and resistance increase at a temperature of 700° C. or higher has been reported. The high temperature instability of the PtSi has also been observed in the degradation of the PtSi/n-Si Schottky diode. Annealing such diodes to a temperature of 700° C. or higher will cause large reverse leakage current and non-ideal forward current-voltage characteristics with lowered Schottky barrier height and an ideality factor much larger than unity. This is due to the reason that the Pt from the PtSi has diffused into the silicon substrate.

Up to the present, the only method that can slightly improve the high temperature instability associated with the PtSi/Si structure is to produce a film with a Si/Pt atomic ratio higher than that in the eutectic to bypass the eutectic composition and hence to improve the stability. This method is achieved by co-sputtering silicon rich alloy. The co-sputtered silicon rich alloy prevents the agglomeration of the platinum silicide, but increases the resistivity and decreases the Schottky barrier height of the film. Electrical properties, such as forward and reverse current-voltage characteristics, of the PtSi/Si structure still degrade after high temperature annealing. Furthermore, this method is not compatible with the modern VLSI process.

SUMMARY OF THE INVENTION

It is therefore one object of the present invention to provide a method of improving the high temperature stability of PtSi/Si structure.

It is another object of the present invention to provide a method of adjusting the Schottky barrier height of the PtSi/Si Schottky contact.

It is the final object of the present invention to incorporate PtSi into an integrated circuit during an early or middle stage of the fabrication process of VLSI so as to improve the devices and/or circuit performance.

The above objects can be achieved by implanting sufficient amount of fluorine-contained ions into the PtSi/Si structure. Generally, as long as the dose of the fluorine ion penetrated into the Si substrate exceeds $1 \times 10^{14}$ cm$^{-2}$, the PtSi/Si structure obtained can be subjected to an annealing temperature higher than 800° C., and the Schottky barrier can be adjusted to as high as 0.984 eV.

Further objects, features and advantages of this invention will appear more fully in the following description.

BRIEF DESCRIPTION OF THE DRAWINGS

The present invention will be explained in more detail on the basis of an exemplary embodiment with reference to the drawings, in which:

FIG. 1 is a diagram showing the sheet resistance of the F+ implanted and unimplanted PtSi/Si samples versus annealing temperature;

DETAILED DESCRIPTION OF THE PREFERRED EMBODIMENT

According to the method of the present invention, the fluorine-contained ions can be directly implanted into a PtSi/Si structure prepared by co-deposition of Pt and Si substances on a Si substrate or by direct reaction of Pt/Si at a low temperature or can be implanted into a Pt/Si structure followed by high temperature annealing or can be implanted into a Si substrate followed by Pt or PtSi film deposition and high temperature annealing. In the following paragraphs, the method of the present invention will be described with respect to the implantation of fluorine-contained ions into a Pt/Si structure followed by high temperature annealing.

The starting material was a crystalline n-type (100) oriented 4–10 $\Omega$-cm phosphorus doped silicon wafer. Following the standard RCA cleaning process, a 470 nm oxide was thermally grown and a junction area of $1000 \times 1000$ $\mu$m$^2$ was defined by a photolithographic technique and BOE etching. A Pt film of 30 nm thickness was then deposited at a rate of 0.1 nm/sec in an e-beam evaporation system with a base pressure below $4 \times 10^{-6}$ torr. Fluorine ions (F+) were implanted to a dose of $2 \times 10^{15}$ cm$^{-2}$ at 30 KeV (some wafers were implanted by BF$_2$+ ions to a dose of $5 \times 10^{15}$ cm$^{-2}$ at 80 KeV) followed by a 400° C. furnace annealing in N$_2$ atmosphere for 60 min. Unreacted Pt was selectively etched by dilute hot aqua regia. Wafers were further annealed at higher temperatures ranging from 700° to 850° C. for 90 min in a N$_2$ atmosphere.

Figure 2A:
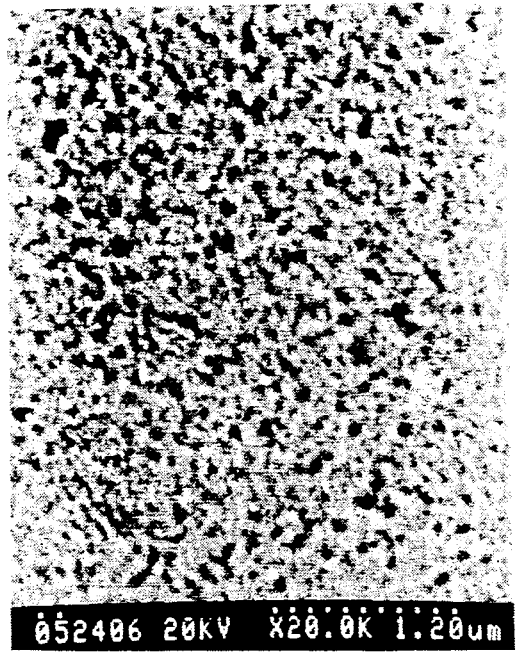
FIG. 2A is a SEM micrograph of the silicide-stripped silicon surface of a F+ implanted sample.
Figure 2B:
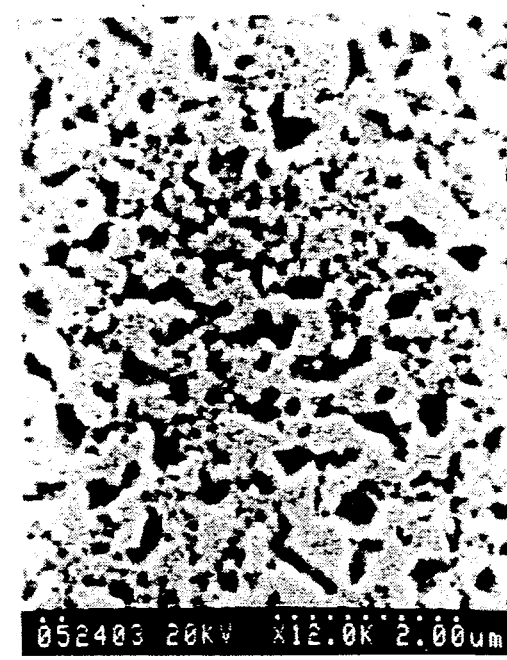
FIG. 2B is a SEM micrograph of the silicide-stripped silicon surface of an un-implanted sample.
Figure 3:
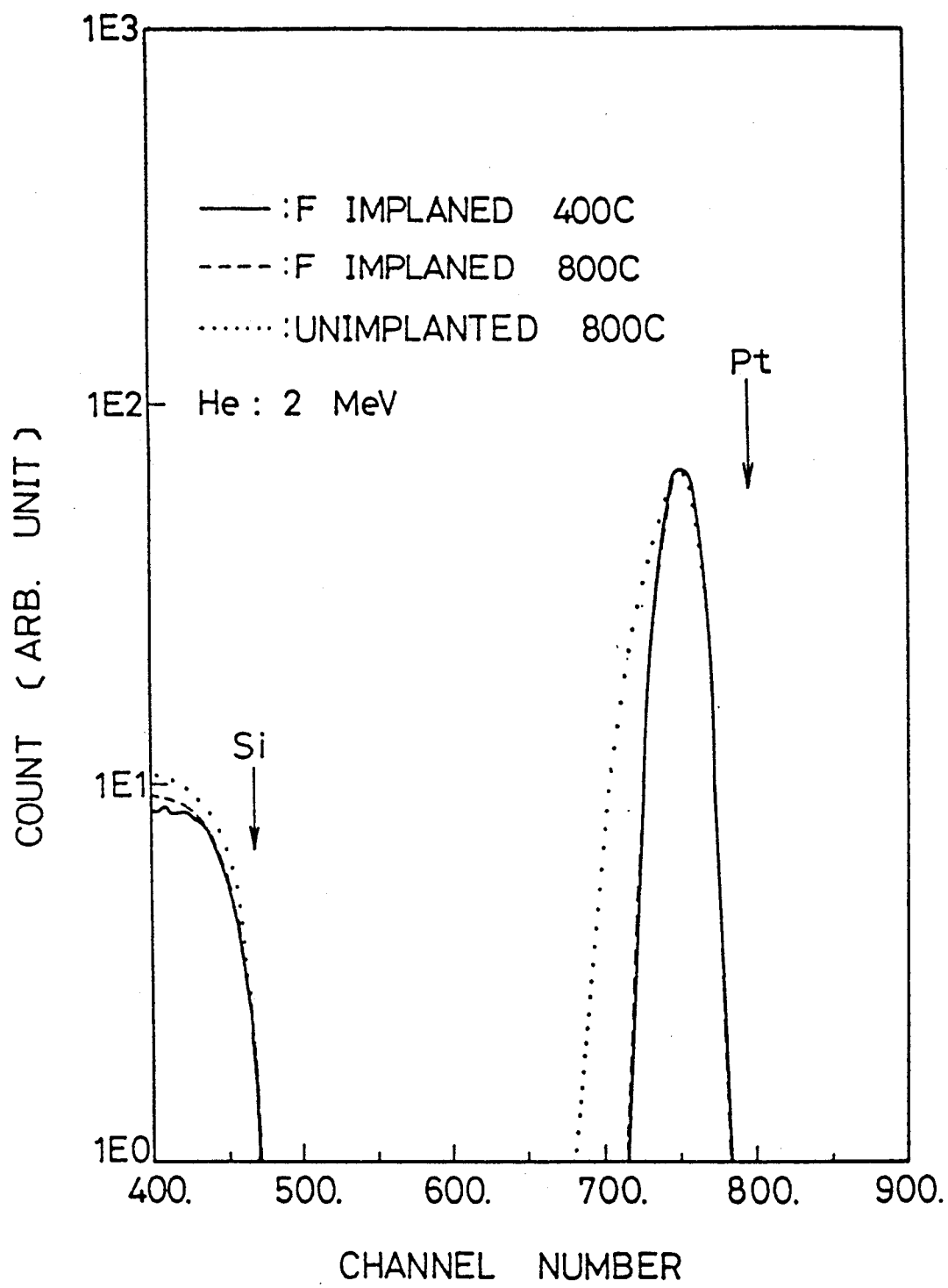
FIG. 3 is a diagram showing the RBS profiles of the PtSi/Si structure with F+ implantation followed by 400° and 800° C. annealing, respectively, and the profile of the PtSi/Si structure annealed at 800° C. without F+ implantation.

FIG. 1 shows the sheet resistance ($R_S$) of the $F^+$ implanted and unimplanted PtSi/n-Si samples after annealing at various temperatures. It is apparent that the high temperature stability is preserved up to 800° C. for the $F^+$ implanted samples. SEM micrograph of the PtSi-stripped silicon surface after 800° C. annealing with and without fluorine implantation are shown in FIG. 2A and FIG. 2B, respectively. It is obvious that the $F^+$ implantation can prevent the PtSi film from agglomeration and prevent Pt from diffusing into the silicon substrate efficiently. Rutherford backscattering spectroscopy (RBS) also shows that for the $F^+$ implanted sample the Pt atom does not penetrate into the silicon substrate after an 800° C. annealing, while it has penetrated deeply for the unimplanted sample at 800° C., as illustrated in FIG. 3.

Figure 4:
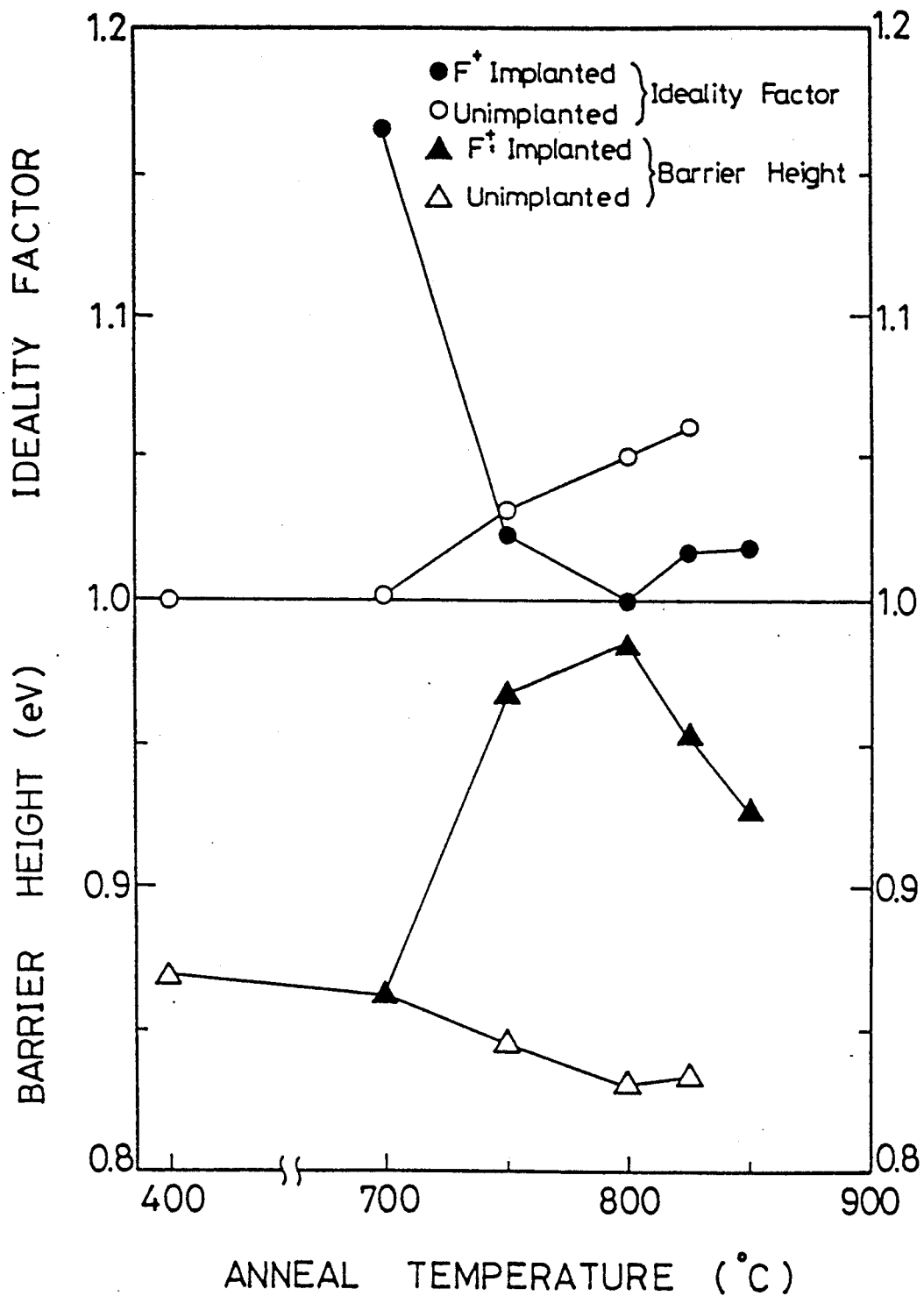
FIG. 4 is a diagram showing the ideality factor and barrier height of the F+ implanted and unimplanted PtSi/n-Si samples versus annealing temperature.

Schottky diode characteristics of the $F^+$ implanted and unimplanted PtSi/n-Si sample were also examined. FIG. 4 shows the ideality factor (n) and the Schottky barrier height ($\phi_{bn}$) of the $F^+$ implanted and unimplanted PtSi/n-Si diodes annealed at various temperatures. For the unimplanted diodes, the barrier height decrease and the ideality factor increases at an annealing temperature higher than 700° C. However, for the $F^+$ implanted diodes, the barrier height increase to 0.984 eV at 800° C. annealing temperature and may be varied by adjusting the annealing temperature around 800° C., while the ideality factor remains at an acceptable value (lower than 1.05).

The mechanism by which the fluorine ion improves the high temperature stability and varies the Schottky barrier can be explained by the "Fluorine Barrier Model." During the high temperature annealing process, the implanted fluorine ion out-diffuses and piles up at the PtSi/Si interface. This phenomenon is correlated with the strong binding energy of the Si-F bond (5.73 eV) such that the fluorine atom can be easily bonded to the dangling bond of Si at the PtSi/Si interface. If the concentration of the accumulated fluorine layer is high enough, it acts as a barrier to prevent transport of Pt into the silicon substrate. Thus, even after annealing at a temperature as high as 800° C., the PtSi/Si-Si structure remains stable. Since the fluorine atoms are bonded to the dangling bond of Si at the PtSi/Si-Si interface, the surface states are substantially diminished. Thus, the Schottky barrier height is dominated by the difference of the work function of PtSi and the electron affinity of Si. This explains the barrier variation phenomenon.

Figure 5:
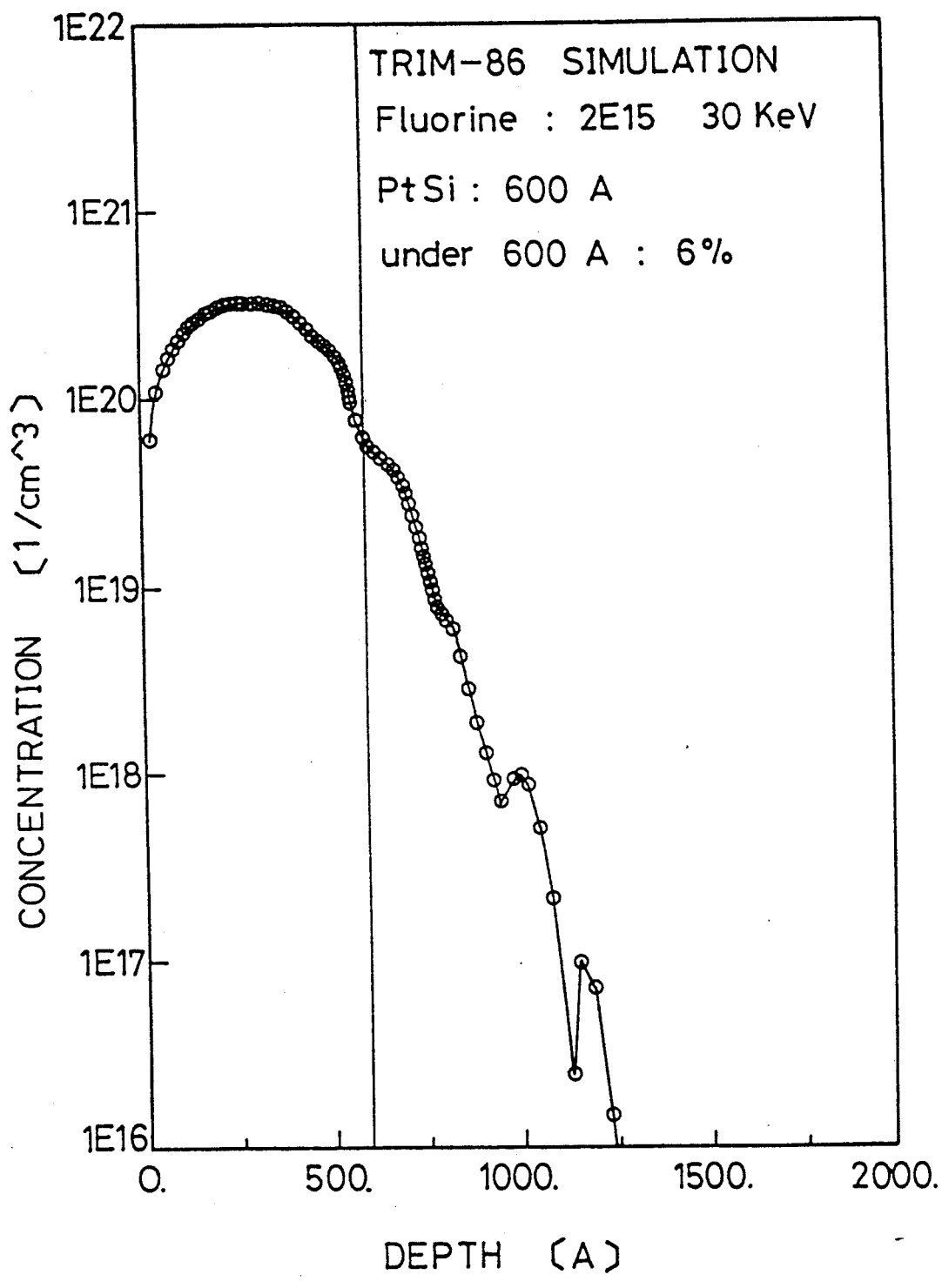
FIG. 5 is a diagram showing the F+ ion distribution in the PtSi(60 nm)/p-Si sample with 30 keV F+ implantation (the implantation dose is $2 \times 10^{15}$ cm$^{-2}$) obtained by using TRIM-86 Monte Carlo simulation.
Figure 6:
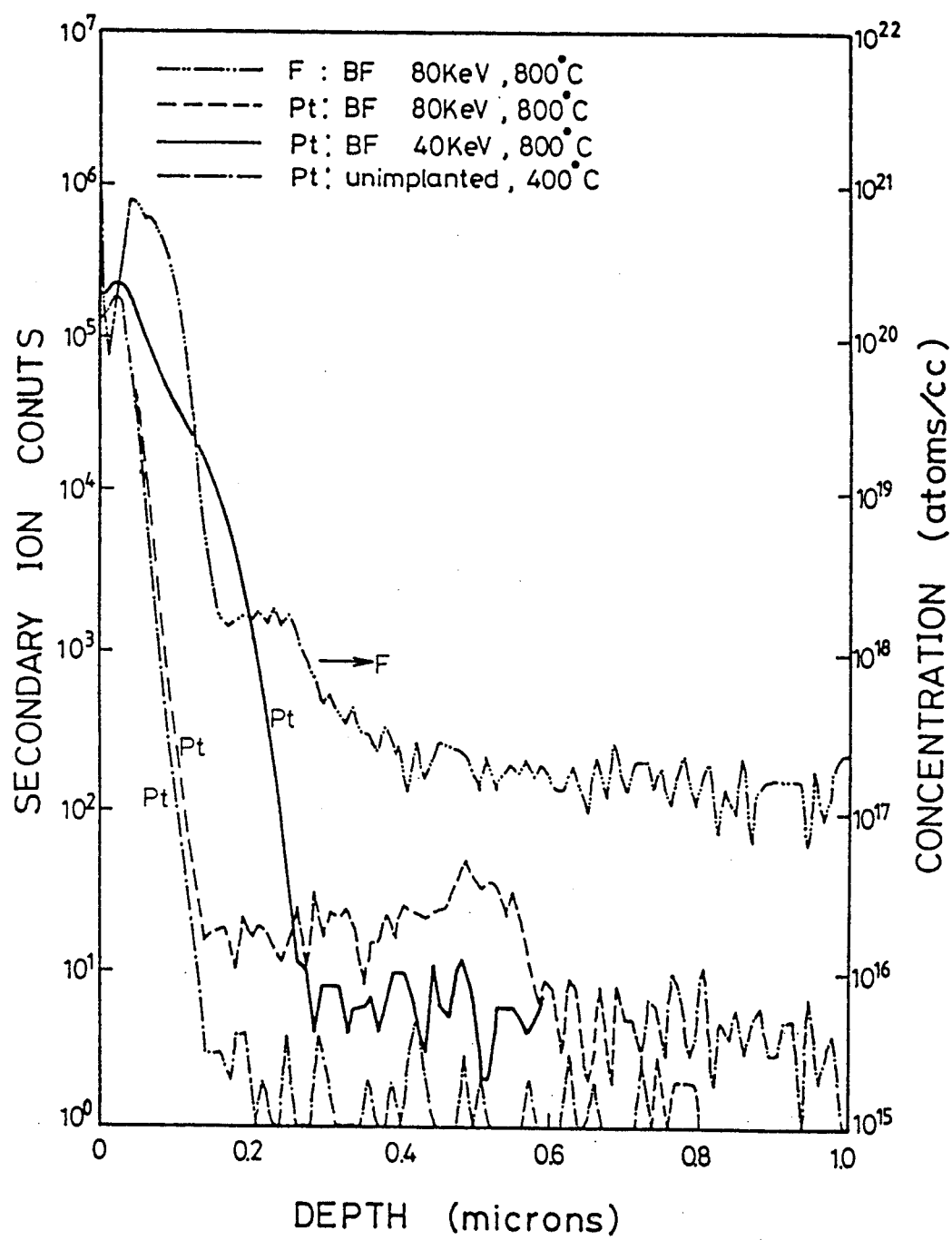
FIG. 6 is a diagram showing the distributions of Pt and F of samples having PtSi(60 nm)/n-Si structure, obtained by using SIMS.

The minimum $F^+$ ion dose of $1 \times 10^{14}$ cm$^{-2}$, which must be incorporated into the Si substrate for improving the high temperature stability of PtSi/Si structure, applies to a Si substrate of both impurity types and various doping concentration. $BF_2^+$ was implanted into Pt/n-Si or PtSi/n-Si substrate to form a PtSi/p$^+$n shallow junction, and $F^+$ and $As^+$ were also respectively implanted into a Pt/p-Si or PtSi/p-Si substrate to form a PtSi/n$^+$p shallow junction; in both cases, the same result of high temperature stability was obtained. It is also to be noted that the minimum $F^+$ ion dose, i.e. $1 \times 10^{14}$ cm$^{-2}$, is refers to the amount of $F^+$ ion that is penetrated into the silicon substrate. This amount is calculated by a TRIM-86 Monte Carlo simulation based on the implantation energy and the thickness of Pt or PtSi of the Pt/Si or PtSi/Si structure. FIG. 5 is a diagram showing the $F^+$ ion distribution of the PtSi (60 nm)/p-Si sample which is implanted with $F^+$ ions at 30 KeV to a dose of $2 \times 10^{15}$ cm$^{-2}$. From this, the concentration of $F^+$ ions implanted into the Si substrate was calculated to be $1.2 \times 10^{14}$ cm$^{-2}$. Furthermore, as shown in FIG. 5, the concentration of $F^+$ ions implanted into the Si substrate is the highest at the surface of the silicon substrate, i.e. at the PtSi/Si interface, and decreases gradually with increasing depth. This is a suitable and effective ion implantation. If the energy for the ion implantation is too small such that most of the $F^+$ ions can not enter the Si substrate, no effect can be obtained. However, if the energy for the ion implantation is too large such that most of the $F^+$ ions penetrate deeply into the Si substrate away from the PtSi/Si interface, also no effect can be obtained. This is because the promotion of high temperature stability of the PtSi/Si structure by the $F^+$ ion implantation is due to the pileup of $F^+$ ion at the PtSi/Si interface and the $F^+$ ion's bonding to the dangling bond of Si atom at the Si surface to form Si-F bonds so as to prevent the Pt atoms in the PtSi film from diffusing into the Si substrate. FIG. 6 is a diagram showing the distributions of F and Pt of the samples prepared by implanting $BF_2^+$ ion into a PtSi (60 nm)/n-Si structure followed by high temperature annealing. This diagram is obtained by using Secondary Ion Mass Spectroscopy (SIMS). From this diagram, it is clear that during annealing, the $F^+$ ion has a tendency to pile up at the PtSi/Si interface. However, if the $F^+$ ion is implanted too deep such that the $F^+$ ion cannot be piled up at the PtSi/Si Pt interface in time, no good result can be expected. It is also known from FIG. 6 that 80 keV is an appropriate implantation energy, while 40 keV is too small to obtain the desired effect and therefore Pt diffuses into Si substrate in a large amount after annealing at 800° C. The energy for implantation depends on the species of the fluorine-containing ion used (such as $F^+$ or $BF_2^+$) and the thickness of Pt in the Pt/Si structure or the thickness of PtSi in the PtSi/Si structure.

The apparatus employed for carrying out the method of the present invention, such as the ion implanter, and the fluorine-contained source, such as $F^+$ or $BF_2^+$, are very commonly used in semiconductor industry and therefore the method of the present invention can be easily performed in a general semiconductor fabrication factory.

While this invention has been described with respect to a preferred embodiment, it is to be understood that the invention is not to be limited to the disclosed embodiment but, on the contrary, is intended to cover various modifications and equivalent arrangements included within the spirit and scope of the appended claims.

What is claimed is:

1. In a method of forming a PtSi/Si structure having a PtSi/Si interface, which includes implanting fluorine-containing ions in the PtSi/Si structure and annealing, the improvement wherein any annealing prior to the implanting of fluorine-containing ions is low temperature annealing and high temperature annealing is performed after the implanting of fluorine-containing ions, whereby $F^+$ ions are concentrated at the PtSi/Si interface and the PtSi/Si structure is sustainable at high temperature.

2. A method as claimed in claim 1, wherein said PtSi/Si structure is formed by depositing Pt on the silicon substrate followed by a low temperature annealing.

3. A method as claimed in claim 2, wherein said low temperature is less than 700° C.

4. A method as claimed in claim 1, wherein said fluorine-contained ion is $F^+$.

5. A method as claimed in claim 1, wherein the amount of fluorine ions which penetrate into the Si substrate is at least $1 \times 10^{14}$ cm$^{-2}$.

6. A method as claimed in claim 5, wherein said fluorine-containing ion is F$^+$.

7. A method as in claim 1, wherein the low temperature annealing is at less than 700° C. and the high temperature annealing is at greater than 700° C.

8. A method of varying the Schottky barrier height of PtSi/Si contact by fluorine-containing ion implantation and thereafter annealing at a temperature greater than 700° C.

9. A method as claimed in claim 8, including the step of forming a PtSi/Si structure by depositing Pt on a silicon substrate followed by a low temperature annealing, the low temperature annealing preceding the high temperature annealing.

10. A method as claimed in claim 9, wherein said low temperature is less than 700° C.

11. A method as claimed in claim 9, wherein said ion implantation is performed before said Pt deposition.

12. A method as claimed in claim 9, wherein said ion implantation is performed after said Pt deposition.

13. A method as claimed in claim 9, wherein said ion implantation is performed after said Pt deposition and said low temperature annealing.

14. A method as claimed in claim 9, wherein the amount of fluorine ions which penetrate into said Si substrate is at least $1 \times 10^{+14}$ cm$^{-2}$.

15. A method of forming a high temperature sustainable PtSi/Si structure comprising the steps of:
    implanting fluorine-containing ions at a surface of a crystalline silicon substrate;
    after said step of implanting fluorine-containing ions, depositing Pt on the surface of the silicon substrate to obtain a crystalline Pt/Si structure; and
    after said step of depositing Pt, annealing the Pt/Si structure to obtain a PtSi/Si structure having a PtSi/Si interface with F$^+$ ions concentrated at the PtSi/Si interface, whereby the PtSi/Si structure is sustainable at high temperature.

16. In a method of forming a PtSi/Si structure, which includes depositing Pt on a surface of the silicon substrate to obtain a Pt/Si structure having a Pt/Si interface, annealing, and implanting fluorine-containing ions in the PtSi/Si structure, the improvement wherein the annealing is performed only after the Pt is deposited on the silicon substrate and includes annealing the Pt/Si structure at a temperature of less than 700° C. to obtain a PtSi/Si structure having a PtSi/Si interface, the method including implanting the fluorine-containing ions in the PtSi/Si structure so as to concentrate F$^+$ ions at the PtSi/Si interface, whereby the PtSi/Si structure is sustainable at high temperature.

17. A method of forming a high temperature sustainable PtSi/Si structure comprising the steps of:
    depositing Pt on a surface of the silicon substrate to obtain a Pt/Si structure having a Pt/Si interface;
    after said step of depositing Pt, implanting fluorine-containing ions in the Pt/Si structure so as to concentrate F$^+$ ions at the Pt/Si interface; and
    after said step of implanting fluorine-containing ions, annealing the Pt/Si structure to obtain a PtSi/Si structure having a PtSi/Si interface with F$^+$ ions concentrated at the PtSi/Si interface, whereby the PtSi/Si structure is sustainable at high temperature.

18. A method of forming a high temperature sustainable PtSi/Si structure, comprising the steps of:
    depositing Pt on a surface of the silicon substrate to obtain a Pt/Si structure having a Pt/Si interface;
    after said step of depositing Pt, low temperature annealing the Pt/Si structure to obtain a PtSi/Si structure having a PtSi/Si interface; and
    after said step of annealing the Pt/Si structure, implanting fluorine-containing ions in the PtSi/Si structure so as to concentrate F$^+$ ions at the PtSi/Si interface, whereby the PtSi/Si structure is sustainable at high temperature.

19. A method of forming a high temperature sustainable PtSi/Si structure, comprising the steps of:
    co-depositing Pt and Si on a silicon substrate to form a PtSi/Si structure having a PtSi/Si interface and
    implanting fluorine-containing ions in the PtSi/Si structure such that the F$^+$ ions concentrate at the PtSi/Si interface.

20. A method of varying a Schottky barrier height of a PtSi/Si contact, comprising the steps:
    co-depositing Pt and Si on a silicon substrate to form the PtSi/Si contact;
    implanting fluorine-containing ions in the PtSi/Si contact; and
    after said step of implanting fluorine-containing ions, annealing the PtSi/Si structure at a temperature of greater than 700° C. to establish a Schottky barrier height of the PtSi/Si contact.

21. A method as claimed in claim 20, wherein said ion implantation is performed after said co-deposition of Pt and Si.

* * * * *